US009646744B2

(12) United States Patent
Sepulveda et al.

(10) Patent No.: US 9,646,744 B2
(45) Date of Patent: May 9, 2017

(54) METHOD FOR MANUFACTURING A SURFACE MOUNT DEVICE

(71) Applicant: Littlefuse, Inc., Chicago, IL (US)

(72) Inventors: Mario G. Sepulveda, Newark, CA (US); Martin G. Pineda, Fermont, CA (US); Anthony Vranicar, Santa Clara, CA (US); Kedar V. Bhatawadekar, Santa Clara, CA (US); Minh V. Ngo, San Jose, CA (US); Dov Nitzan, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 16 days.

(21) Appl. No.: 14/513,568

(22) Filed: Oct. 14, 2014

(65) Prior Publication Data

US 2016/0104559 A1 Apr. 14, 2016

(51) Int. Cl.

| | |
|---|---|
| ***H01L 29/00*** | (2006.01) |
| ***H01C 1/034*** | (2006.01) |
| ***H01C 1/14*** | (2006.01) |
| ***H01C 7/00*** | (2006.01) |
| ***H01C 17/02*** | (2006.01) |

(52) U.S. Cl.

CPC ........... *H01C 1/034* (2013.01); *H01C 1/1406* (2013.01); *H01C 7/001* (2013.01); *H01C 17/02* (2013.01)

(58) Field of Classification Search

CPC .. H01C 1/034142; H01C 17/00; H01C 7/028; H01C 17/027; H01C 17/028; H01C 17/06553; Y10T 156/1052; Y10T 428/239

See application file for complete search history.

(56) References Cited

U.S. PATENT DOCUMENTS

| | | | |
|---|---|---|---|
| 6,023,403 A | 2/2000 | McGuire et al. | |
| 6,121,118 A * | 9/2000 | Jin | H01L 21/67092 257/E21.599 |
| 6,372,619 B1 * | 4/2002 | Huang | H01L 23/3114 257/E21.508 |
| 8,525,635 B2 | 9/2013 | Navarro et al. | |

(Continued)

FOREIGN PATENT DOCUMENTS

JP H09-320808 A 12/1997

OTHER PUBLICATIONS

International Search Report for International Application No. PCT/US2015/055313, mailed Nov. 27, 2015.

*Primary Examiner* — Dale E Page
*Assistant Examiner* — Quovaunda V Jefferson

(57) ABSTRACT

A method of manufacturing a surface mount device includes forming a plaque from a material, forming a plurality of conductive protrusions on a top surface and a bottom surface of the plaque, and applying a liquid encapsulant over at least a portion of the top surface and at least a portion of the bottom surface of the plaque. The liquid encapsulant is cured and when cured encapsulant has an oxygen permeability of less than about 0.4 cm3·mm/m2·atm·day. The assembly is cut to provide a plurality of components. After cutting, the top surface of each component includes at least one conductive protrusion, the bottom surface of each component includes at least one conductive protrusion, the top surface and the bottom surface of each component include the cured encapsulant, and a core of each component includes the material.

9 Claims, 10 Drawing Sheets

(56) References Cited

U.S. PATENT DOCUMENTS

| | | | | |
|---|---|---|---|---|
| 2008/0309443 | A1* | 12/2008 | Furuya | H01F 17/045 336/83 |
| 2011/0011533 | A1* | 1/2011 | Golden | C08G 59/1466 156/330 |
| 2011/0014415 | A1* | 1/2011 | Navarro | H01C 1/142 428/76 |
| 2011/0241818 | A1 | 10/2011 | Sha et al. | |

* cited by examiner

METHOD FOR MANUFACTURING A SURFACE MOUNT DEVICE

CROSS-REFERENCE TO RELATED APPLICATIONS

This application is related to U.S. application Ser. No. 14/513,552, titled “Method of Manufacturing a Surface Mount Device”, filed contemporaneously with the present application, the disclosure of which is incorporated herein by reference.

BACKGROUND

Field of the Invention

The present invention relates generally to electronic circuitry. More specifically, the present invention relates to a method for manufacturing a surface mount device (SMD).

Introduction to the Invention

Surface mount devices (SMDs) are utilized in electronic circuits because of their small size. Generally, SMDs comprise a core device embedded within a housing material, such as plastic or epoxy. For example, a core device with resistive properties may be embedded in the housing material to produce a surface mount resistor.

One disadvantage with existing SMDs is that the materials utilized to encapsulate the core device tend to allow oxygen to permeate into the core device itself. This could be adverse for certain core devices. For example, the resistance of a positive-temperature-coefficient core device tends to increase over time if oxygen is allowed to enter the core device. In some cases, the base resistance may increase by a factor of five (5), which may take the core device out of spec.

To overcome these problems, the core device may be encapsulated with a low oxygen permeability, such as the oxygen barrier material described in U.S. Pat. No. 8,525,635, issued Sep. 3, 2013 (Navarro et al.), and U.S. Publication No. 2011/0011533, published Jan. 20, 2011 (Golden et al.).

Current methods for manufacturing SMDs such as those described above yield SMDs with a relatively large volume of encapsulant in comparison to the total volume of the SMD. For example, the volume of the encapsulant may correspond to 35-40% of the total volume.

SUMMARY

In one aspect, a method of manufacturing a surface mount device includes providing at least one core device and at least one lead frame. The core device is attached to the lead frame. The core device and the lead frame are encapsulated within an encapsulant. The encapsulant comprises a liquid epoxy that when cured has an oxygen permeability of less than approximately 0.4 cm3·mm/m2·atm·day.

In a second aspect, a surface mount device includes a core device, and a portion of a lead frame that is attached to the core device. An encapsulant surrounds at least a portion of the core device and a portion the lead frame. The encapsulant corresponds to a cured version of a liquid epoxy that is injected around the core device and the lead frame. The encapsulant and has an oxygen permeability of less than approximately 0.4 cm3·mm/m2·atm·day.

In a third aspect, a method of manufacturing a surface mount device includes forming a plaque from a material, forming a plurality of conductive protrusions on a top surface and a bottom surface of the plaque, and applying a liquid encapsulant over at least a portion of the top surface and at least a portion of the bottom surface of the plaque. The liquid encapsulant is cured and when cured encapsulant has an oxygen permeability of less than about 0.4 cm3·mm/m2·atm·day. The assembly is cut to provide a plurality of components. After cutting, the top surface of each component includes at least one conductive protrusion, the bottom surface of each component includes at least one conductive protrusion, the top surface and the bottom surface of each component include the cured encapsulant, and a core of each component includes the material.

In a fourth aspect, a surface mount device (SMD) includes a core formed from a material, at least one conductive protrusion formed on a top surface of the core and at least one conductive protrusion formed on a bottom surface of the core, and an encapsulant that covers at least a portion of a top surface and of a bottom surface of the core. The encapsulant has an oxygen permeability of less than about 0.4 cm3·mm/m2·atm·day.

DETAILED DESCRIPTION

To overcome the problems described above, a novel method for manufacturing an SMD is provided. In one implementation, the process begins by providing an encapsulant having low oxygen permeability in a liquid epoxy or other form. One or more core devices, a lead frame that defines electrical contacts for the core devices, and other component sections that are part of the final SMD are inserted into the cavity of a transfer molding system. The encapsulant is inserted into the molding system and injected around the various components. After curing, the assembly is removed from the molding system and cut to provide individual SMDs. Various finishing operations (plating, finishing, polishing, etc.) may be performed before or after the SMDs are separated. Using this process, it is possible to manufacture SMDs having a smaller form factor than conventional SMDs. Moreover, production costs are lower than those costs associated with the manufacture of conventions SMDs entirety.

In another implementation, the material that forms the core device above is provided in a plaque. A group of conductive protrusions are applied to top and bottom surfaces of the plaque. A screen-printing process is utilized to screen-print a liquid epoxy over the top and bottom surfaces. The assembly is cured and singulated into components. Each component includes a core that corresponds to a portion of the original plaque, at least one conductive protrusion extending from the top of the core, and at least one conductive protrusion extending from the bottom of the core. Exposed surfaces of the core are covered with additional encapsulant to encapsulate the entire core. Ends of the encapsulated core are covered with first and second conductive layers. Each of the conductive layers is formed to be in electrical contact with one of the conductive protrusions that extends from either the top or the bottom of the core.

The encapsulant materials described above enable the production of surface mount devices or other small devices that exhibit a low oxygen permeability. For example, the encapsulant facilitates manufacturing low oxygen permeability surface mount devices with wall thicknesses between 0.4 mils to 14 mils depending upon the form factor.

Figure 1:
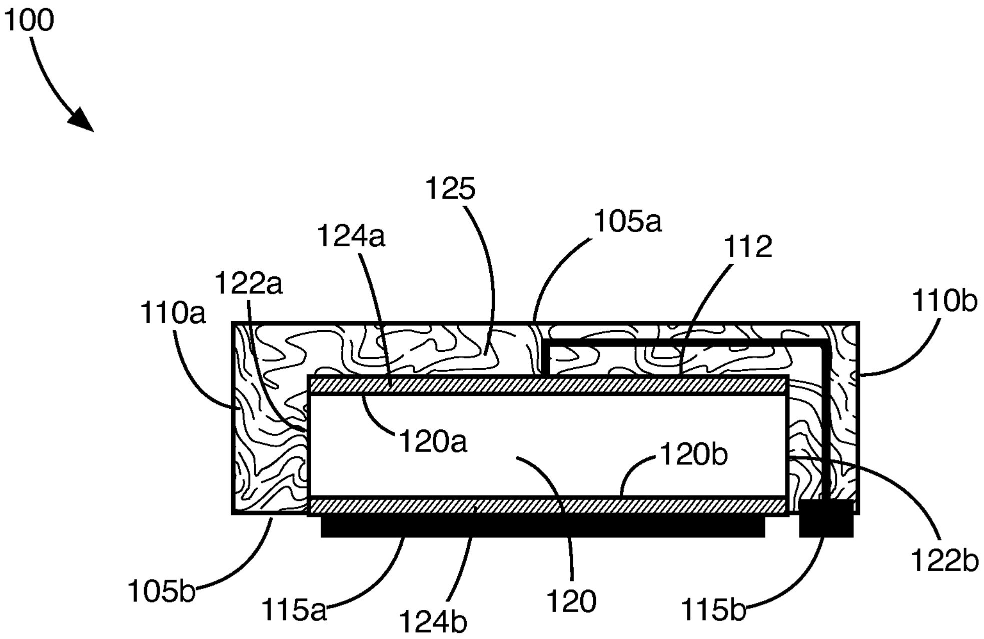
FIG. 1 is a cross-sectional view of an exemplary surface mount device (SMD).

FIG. 1 is a cross-sectional view of one implementation of a surface mount device (SMD) 100. The SMD 100 defines a generally rectangular body with a top surface 105*a*, a bottom surface 105*b*, a first end 110*a*, a second end 110*b*, a first contact pad 115*a*, and a second contact pad 115*b*. The SMD 100 further includes a core device 120 and an insulator material 125 in which the core device 120 is embedded. In one implementation, the distance between the first and second ends 110*ab* may be about 3.0 mm (0.118 in), the width of the SMD 100 may be about 2.35 mm (0.092 in), and distance between top and bottom surfaces 105*ab* may be about 0.5 mm (0.019 in).

The core device 120 includes a top surface 120*a*, a bottom surface 120*b*, a first end 122*a*, and a second end 122*b*. The core device 120 may have a generally rectangular shape. The distance between the first and second ends 122*ab* may be about 3.0 mm (0.118 in). The distance between the top and bottom surfaces 120*ab* may be about 0.62 mm (0.024 in). The distance between front and back surfaces may be about 1.37 mm (0.054 in). A conductive layer 124*ab* may overlay the top and bottom surfaces 120*ab* of the core device 120. For example, the conductive layer 124*ab* may correspond to a 0.025 mm (0.001 in) thick layer of nickel (Ni) and/or a 0.025 mm (0.001 in) thick layer of copper (Cu). The conductive material may cover the entire top and bottom surfaces 120*ab* of the core device 120 or a smaller portion of the top and bottom surfaces 120*ab*.

In one implementation, the core device 120 corresponds to a device that has properties that deteriorate in the presence of oxygen. For example, the core device 120 may correspond to a low-resistance positive-temperature-coefficient (PTC) device comprising a conductive polymer composition. The electrical properties of conductive polymer composition tend to deteriorate over time. For example, in metal-filled conductive polymer compositions, e.g. those containing nickel, the surfaces of the metal particles tend to oxidize when the composition is in contact with an ambient atmosphere, and the resultant oxidation layer reduces the conductivity of the particles when in contact with each other. The multitude of oxidized contact points may result in a 5× or more increase in electrical resistance of the PTC device. This may cause the PTC device to exceed its original specification limits. The electrical performance of devices containing conductive polymer compositions can be improved by minimizing the exposure of the composition to oxygen.

The encapsulant 125 may correspond to an oxygen-barrier material, such as an oxygen-barrier materials with characteristics similar to those described in U.S. Pat. No. 8,525,635, issued Sep. 3, 2013 (Navarro et al.), and U.S. Publication No. 2011/0011533, published Jan. 20, 2011 (Golden et al.), the disclosures of which are incorporated herein by reference. Such a material may prevent oxygen from permeating into the core device 120, thus preventing deterioration of the properties of the core device 120. For example, the oxygen-barrier material may have an oxygen permeability of less than approximately 0.4 cm3·mm/m2·atm·day (1 cm3·mil/100 in2·atm·day), measured as cubic centimeters of oxygen permeating through a sample having a thickness of one millimeter over an area of one square meter. The permeation rate is measured over a 24 hour period, at 0% relative humidity, and a temperature of 23° C. under a partial pressure differential of one atmosphere). Oxygen permeability may be measured using ASTM F-1927 with equipment supplied by Mocon, Inc., Minneapolis, Minn., USA.

In one implementation, the encapsulant 125 corresponds to cured thermoset epoxy that prior to curing possesses a viscosity of between about 1500 cps and 70,000 cps, and 5% to 95% filler content by weight.

The thickness of the encapsulant 125 from the top surface 120*a* of the core device 120 to the top surface 105*a* of the SMD 100 may be in the range of 0.01 to 0.125 mm (0.0004 to 0.005 in), e.g., about 0.056 mm (0.0022 in). The thickness of the encapsulant 125 from the first and second ends 110*ab* of the core device 125 to first and second ends 122*ab*, respectively, of the SMD 100 may be in the range of 0.025 to 0.63 mm (0.001 to 0.025 in), e.g., about 0.056 mm (0.0022 in).

The first and second contact pads 115*ab* are arranged on the bottom surface 105*b* of the SMD 100. The first contact pad 115*a* is electrically coupled to the bottom surface 105*b* of the core device 120. The second contact pad 115*b* is electrically coupled to the top surface 120*a* of the core device 120 via a conductive clip 112, wedge bond, wire bond, etc. that wraps around one side of the core device 120 to thereby couple the top surface 120 of the core device 120 to the second contact pad 115*b*.

The first and second contact pads 115*a* and 115*b* are utilized to fasten the SMD 100 to a printed circuit board or substrate (not shown). For example, the SMD 100 may be soldered to pads on a printed circuit board and/or a substrate via the first and second contact pads 115*a* and 115*b*. Each contact pad 115*ab* may be plated with a conductive material, such as copper. The plating may provide an electrical pathway from the outside of the SMD 100 to the core device 120.

Figure 2:
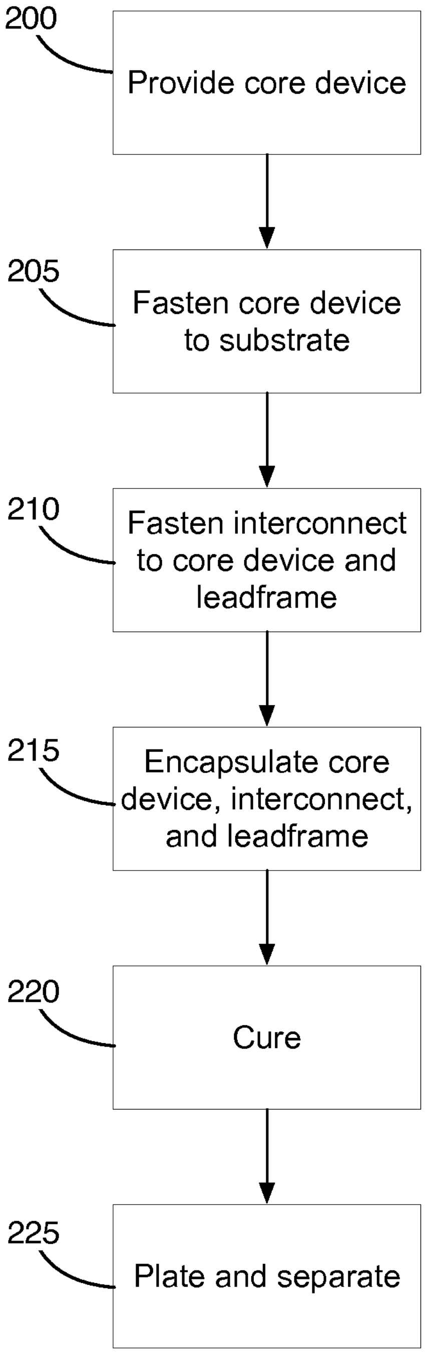
FIG. 2 illustrates an exemplary group of operations that may be utilized to manufacture the SMD of FIG. 1.

FIG. 2 illustrates an exemplary group of operations that may be utilized to manufacture the SMD 100 described in FIG. 1. The operations shown in FIG. 1 are described with reference to FIGS. 3 and 4.

Figure 3:
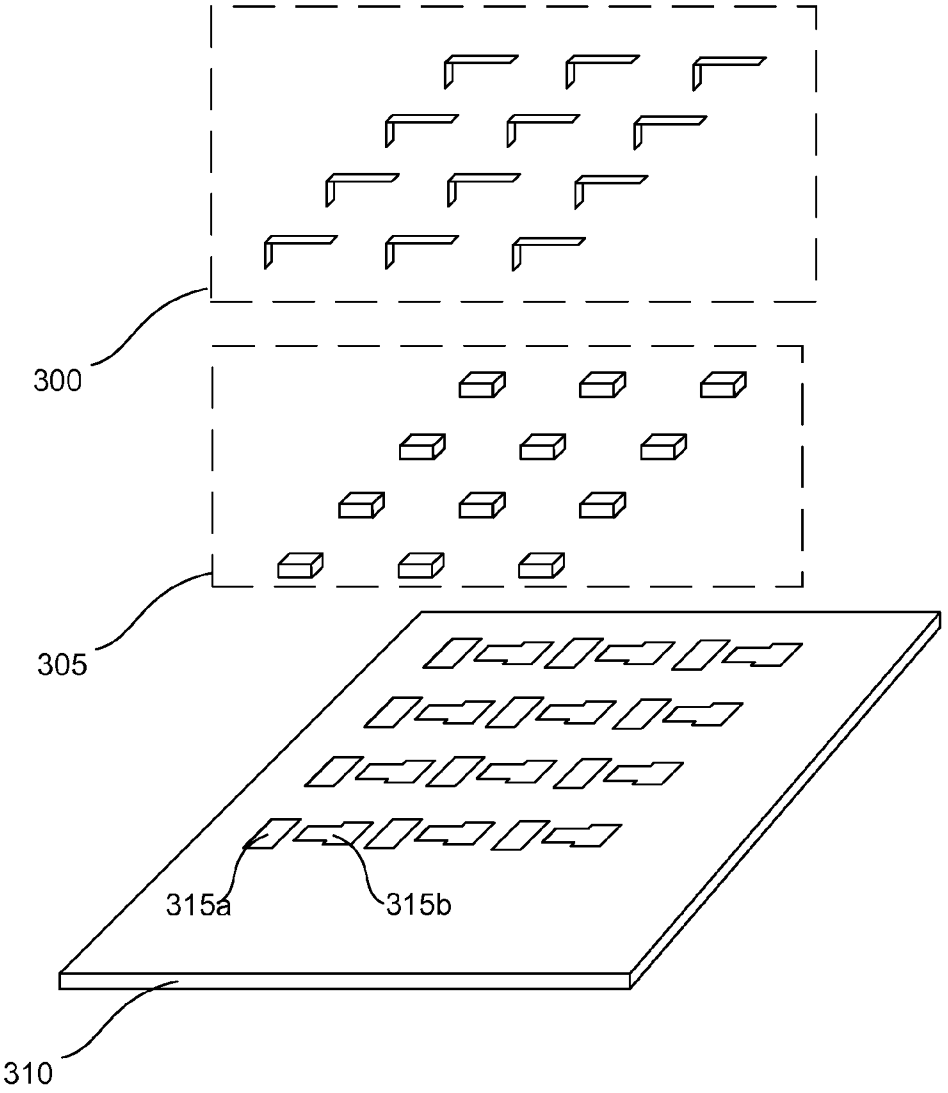
FIG. 3 illustrates component sections of a plurality of SMDs.

At block 200, one or more core devices may be provided. Referring to FIG. 3, several core devices 305 may be provided. The core devices 305 may correspond to the PTC device described above or a different device. To obtain the PTC devices, a PTC material may first be extruded onto a plaque and then cured. Copper or nickel plating may be applied via conventional processes to certain sections of the cured material to define contact pads and/or interconnects. The PTC material may then be cut using conventional processes (i.e., saw, laser, etc.) to separate PTC devices from the material. In some implementations, a conductive epoxy or different type of finishing may be applied to certain sections of each PTC device after separation.

At block 205, core devices 305 may be fastened to a lead frame 310. For example, the core devices 305 may be placed over the lead frame 310. The core devices 305 may be fastened by hand, via pick-and-place machinery, and/or via a different process.

The lead frame 310 may define a plurality of contact pads 315*ab*. The contact pads 315*ab* may correspond to the first and second contact pads 115*ab* illustrated in FIG. 1. The core devices 305 may be fastened to the contact pads 315*ab* defined on the lead frame 310. For example, the bottom surfaces of the core devices 305 may be soldered to the top surfaces of the contact pads 315*ab*.

At block 210, clip interconnects 300 may be fastened to the core devices 305 and the lead frame 310. The horizontal sections of the clip interconnects 300 may be fastened to the top surfaces of the core devices 305, and the opposite end of the clip interconnects 300 may be fastened to one of the contact pads 315*a*. For example, the clip interconnects 300 may be soldered to the top surfaces of the core devices 305 and the contact pads 315*a*.

Figure 4A:
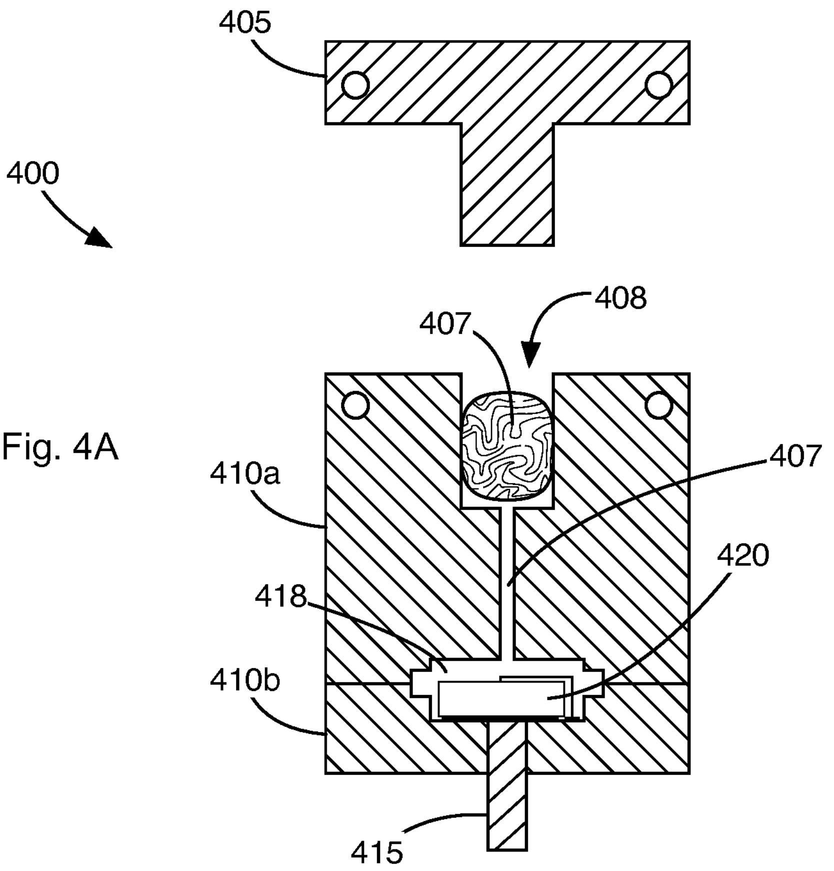
FIGS. 4A and 4B illustrate a molding system for encapsulating the component sections illustrated in FIG. 3.
Figure 4B:
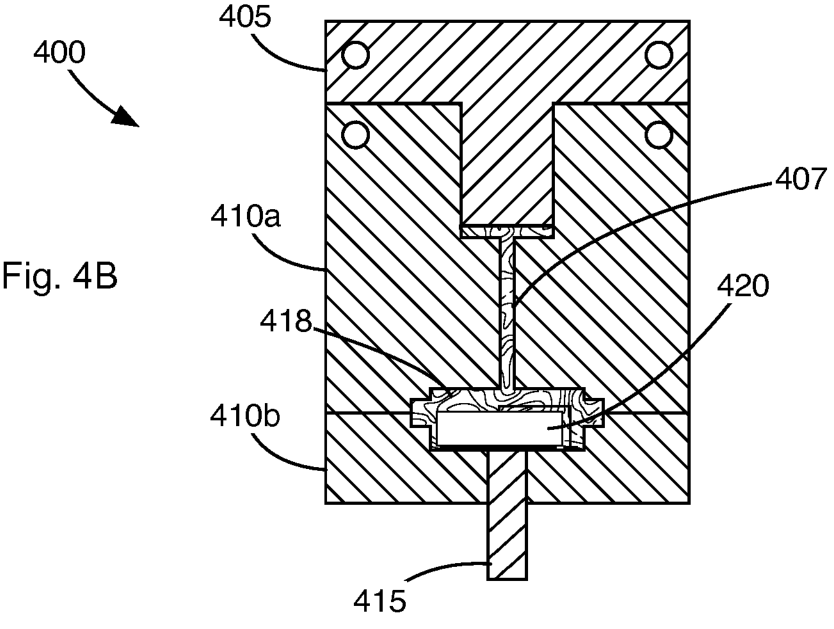

At block 215, the core devices 305, interconnects 300, and top of the lead frame 310 may be encapsulated in an encapsulant, as illustrated in FIGS. 4A and 4B.

Referring to FIG. 4A, an encapsulation material 407 may be applied via a transfer molding process. In this regard, a mold system 400 that includes a cope 410*a* and drag 410*b* may be provided. A cavity 418 is formed between the cope 410*a* and drag 410*b* to shape the encapsulant 407 around one or more core devices, interconnects, and the lead frame. A vent may be provided in the drag to allow air to escape. The vent should not be higher than 20 μm and can be located in the cavity, e.g. at any of the corners of the cavity. The cope 410*a* includes a transfer pot 408 into which the encapsulant 407 is added. The encapsulant 407 may be in the form of a liquid molding thermoset epoxy with a viscosity of between about 1500 cps and 70,000 cps. In some implementations, the epoxy may comprise 5% to 95% filler content by weight.

As illustrated in FIG. 4B, a plunger 405 of the mold system 400 is pressed into the cope 410 to force the encapsulant 407 through a sprue 407 and into the cavity 418. The transfer pot 408 may be heated prior to insertion of the plunger to a temperature of about 20° C.-30° C. to lower the viscosity of the encapsulant 407. A transfer pressure of between about 150 psi and 300 psi may be applied to the plunger 405.

Returning to FIG. 2, at block 220, the encapsulant 407 may be partially or completely cured. For example, the encapsulant 407 may be left in the mold system 400 for about 1-5 minutes to allow the encapsulant 407 to cure. In some implementations, the transfer pot (mold) 408 may be heated to about 120-180 C to accelerate curing.

Figure 8:
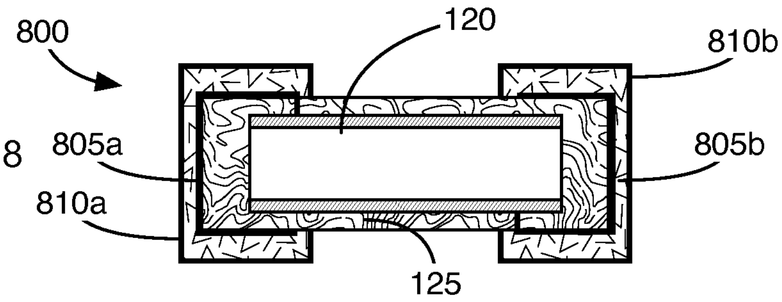

At block 225, the cope 410*a* and drag 410*b* of the mold system 400 are opened. An ejector pin 415 of the mold system 400 may be pressed into a lower side of the cavity to push the assembly out of the mold system 400. After removal, a nickel alloy and/or copper finish may be applied to sections of the assembly, and the SMDs may be separated from the assembly. For example, the SMDs may be cut from the cured configuration with a saw, laser, or other tool. Additional finishing and or polishing steps may be performed to produce the final version of the SMDs. For example, a solderable nickel alloy finish may be applied after separation. (See. FIG. 8.)

Figure 5:
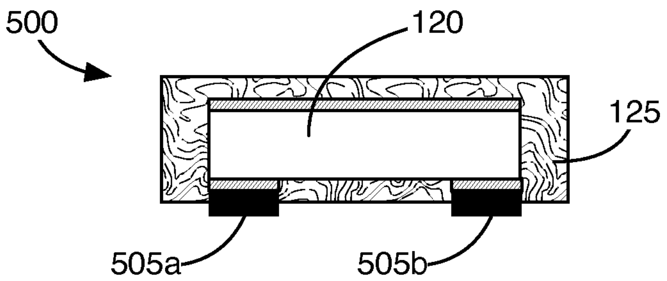
FIGS. 5-8 illustrate exemplary SMD implementations that may be manufactured via the manufacturing operations described in FIG. 2.

FIGS. 5-8 illustrate various alternative SMD implementations that may be manufactured via the process above or variations thereof. Referring to FIG. 5, the SMD 500 may include a core device 120 encapsulated within the encapsulant 125, which may correspond to the encapsulant, described above. In this implementation, and interconnect is not utilized. Rather, first and second copper plates 505*ab* may be applied to opposite ends of the core device 120. The copper plates 505*ab* may be finished with a solderable nickel alloy finish, such as NiSN or NiAu. The copper plates may be applied to the core device(s) 120 prior to encapsulation.

Figure 6:
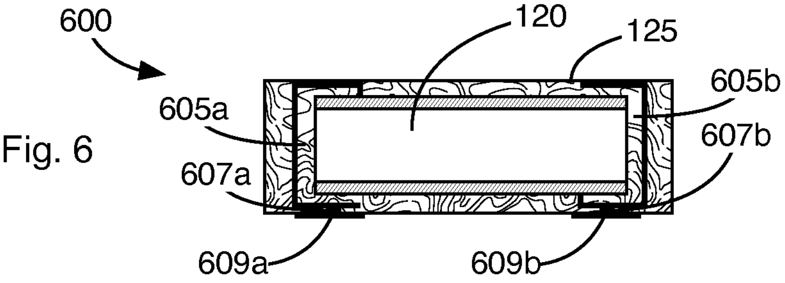

Referring to FIG. 6, the SMD 700 may include a core device 120 encapsulated within the encapsulant 125, which may correspond to the encapsulant, described above. First and second conductive epoxy coatings 605*ab* may be applied to respective ends of the core device 120 prior to encapsulation. Vias 607*ab* may be formed in the lower side of the SMD 600, below each end of the core devices 120, and plated with a conductive material to facilitate electrical contact with the core device 120 from outside the SMD 100. A solderable nickel alloy finished pads 609*ab* finish may be formed around the via openings in the bottom side of the SMD 600.

Figure 7:
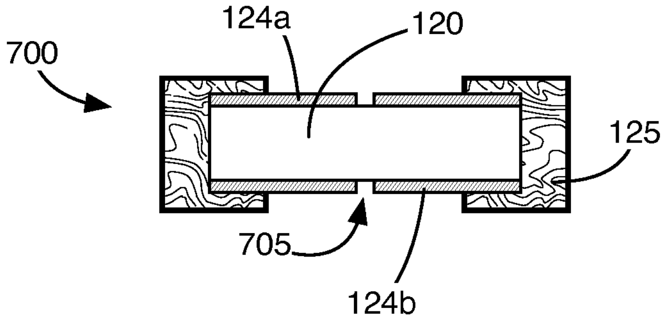

Referring to FIG. 7, the SMD 700 may include a core device 120 encapsulated within the encapsulant 125. The encapsulant 125, which may correspond to the encapsulant described above, is provided on respective ends of the SMD 700. A gap 705 is formed in conductive layers 124*ab*, which cover the top and bottom surfaces of the core device 120.

Referring to FIG. 8, the SMD 800 may include a core device 120 encapsulated within the encapsulant 125, which may correspond to the encapsulant, described above. First and second conductive epoxy coatings 805*ab* may be applied to respective ends of the core device 120 prior to encapsulation. A solderable nickel alloy finish 810*ab* may be provided over the first and second conductive epoxy coatings 805*ab*.

As shown, the novel manufacturing method is capable of producing SMD of various configurations. Moreover, this method is capable of producing SMDs with form factors smaller than those manufactured using conventional processes. While the SMD and the method for manufacturing the SMD have been described with reference to certain embodiments, it will be understood by those skilled in the art that various changes may be made and equivalents may be substituted without departing from the scope of the claims of the application. Many other modifications may be made to adapt a particular situation or material to the teachings without departing from the scope of the claims. Therefore, it is intended that SMD and method for manufacturing the SMD are not to be limited to the particular embodiments disclosed, but to any embodiments that fall within the scope of the claims.

Figure 9:
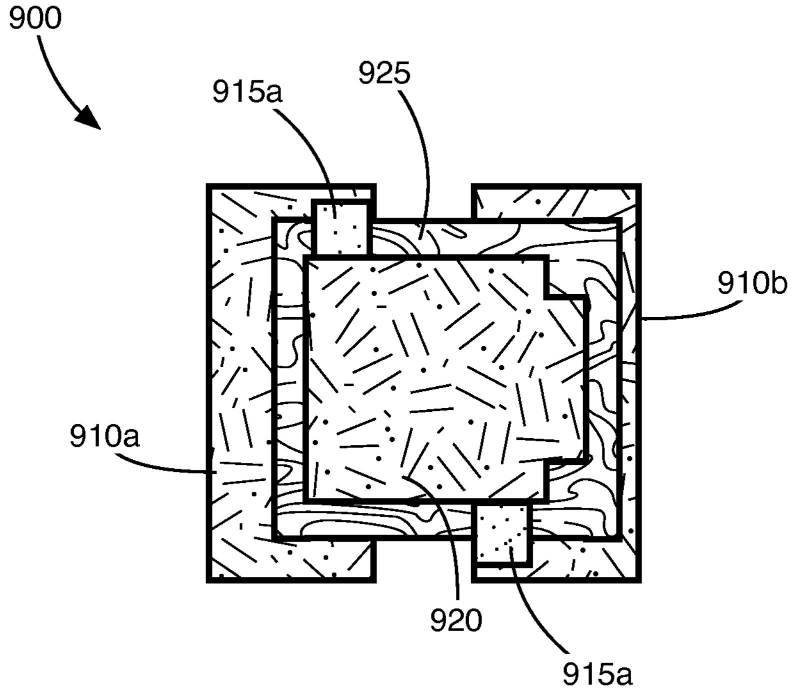
FIG. 9 is a cross-sectional view of another exemplary SMD.
Figure 10:
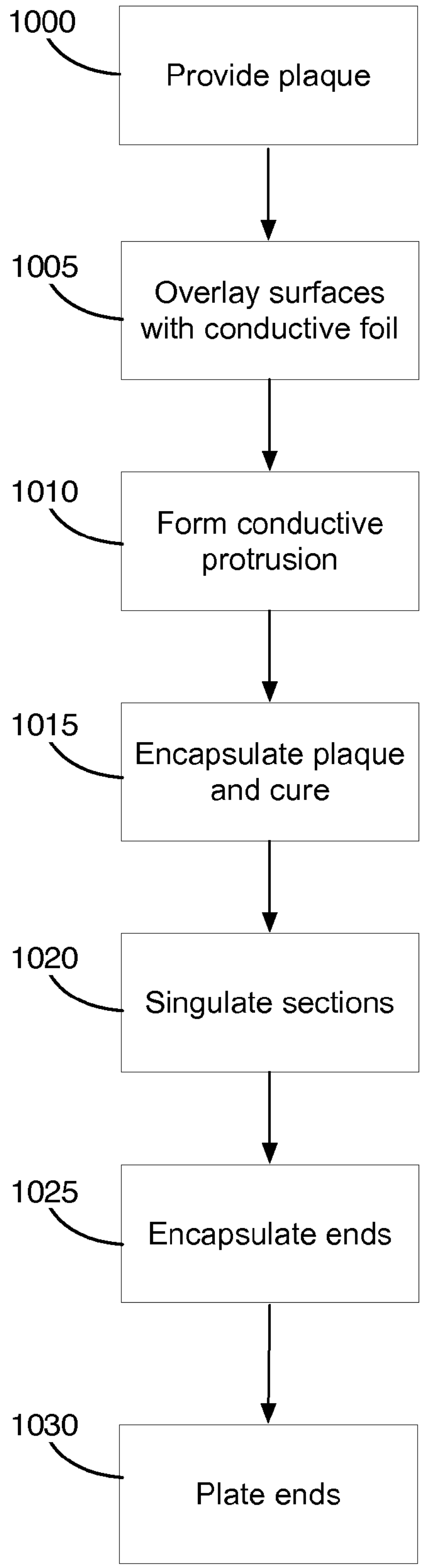
FIG. 10 illustrates an exemplary group of operations that may be utilized to manufacture the SMD of FIG. 9.

FIG. 9 is a cross-sectional view of an exemplary surface mount device (SMD) 900 that may be formed via the operations described in FIG. 10. The SMD 900 defines a generally rectangular body and includes a core device 920 and top and bottom conductive protrusions 915*ab* electrically connected respectively to top and bottom surfaces of the core device 920. An encapsulant 925 is formed around the core device 920. The conductive protrusions 915*ab* extend through the encapsulant 925. First and second conductive ends 910*ab* are formed over encapsulated ends of the core device 920. Each of the first and second conductive ends 910*ab* at least partially overlap one of the top and the bottom conductive protrusions 915 bringing the first and second conductive ends 910*ab* in electrical contact with the top and bottom conductive protrusions 915. In one implementation, the bounds of the SMD 900 define a rectangular volume with a length of about 3.0 mm (0.118 in), a height of about 0.5 mm (0.019 in), and depth of about 2.35 mm (0.092 in).

The core device 920 includes many of the same features as the core device 120 described above. For example, a conductive layer (not shown for clarity) may overlay the top and bottom surfaces the core device 920, in which case the top and bottom conductive protrusions 915*ab* are coupled to the conductive layer. The core device 920 may possess the material properties of the core device 120 described above.

The encapsulant 924 may possess the material properties of the encapsulant 925 described above. However, in this instance, the encapsulant 125 may correspond to a cured thermoset epoxy that prior to curing possesses a viscosity of between about 1500 cps and 70,000 cps, and 5% to 95% filler content by weight.

The thickness or wall thickness of the encapsulant 125 may be between about 0.4 mil to 14 mil. The wall thickness may be uniform on all sides or different.

FIG. 10 illustrates exemplary operations that may be utilized to manufacture the SMD 900 described in FIG. 9. The operations shown in FIG. 10 are best understood with reference to FIGS. 11A-H.

At block 1000, a PTC plaque may be provided. For example, a PTC material may be extruded through a die to form a sheet of PTC material with a desired cross-section, as illustrated by the PTC plaque 1105 shown in FIGS. 11A and 11B.

At block 1005, a conductive surface is formed over the top and bottom surfaces of the plaque. The conductive surface may be copper or a different conductive material.

At block 1010, conductive protrusions (1110, FIGS. 11A and 11B) may be formed on the top and bottom surfaces of the plaque 1105 at sections of the plaque 1105 that will eventually be singulated into individual cores. The conductive protrusions 1110 may be formed after the conductive surface is formed on the top and bottom surfaces of the plaque. Alternatively, the initial thickness of the conductive surface formed at block 1105 may be selected to be the same as the desired height of the conductive protrusions 1110. Then the thickness of the conductive surface may be reduced in sections via a subtractive process such as a chemical and/or mechanical process, leaving other sections unaffected. The unaffected areas will correspond to the conductive protrusions 1110.

Figure 11A:
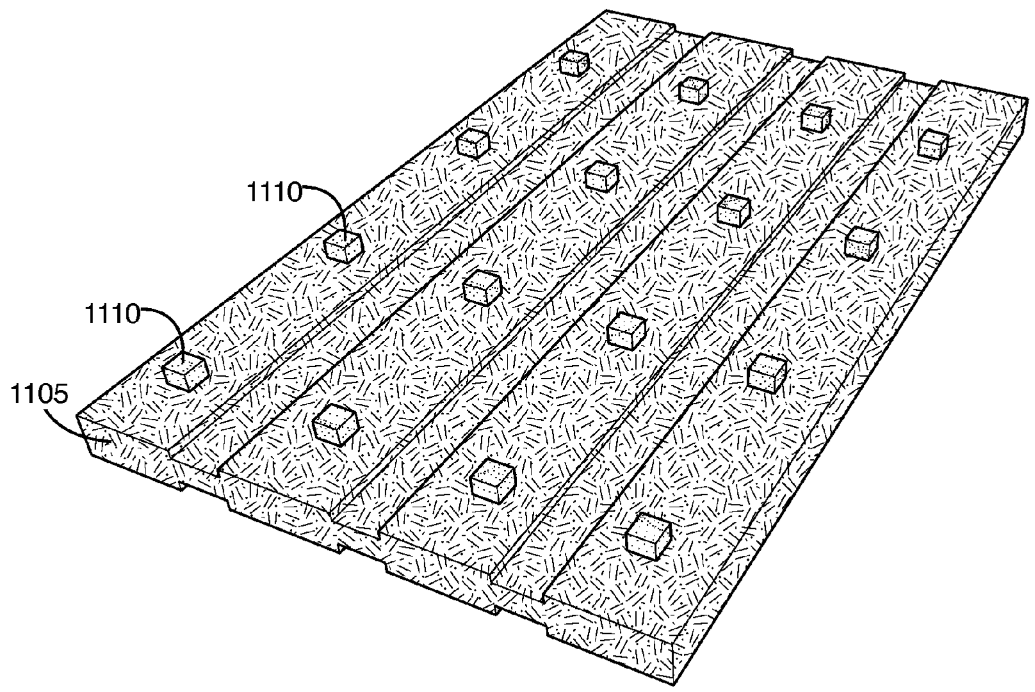
FIG. 11A illustrates a plaque with a group of conductive protrusions.
Figure 11B:
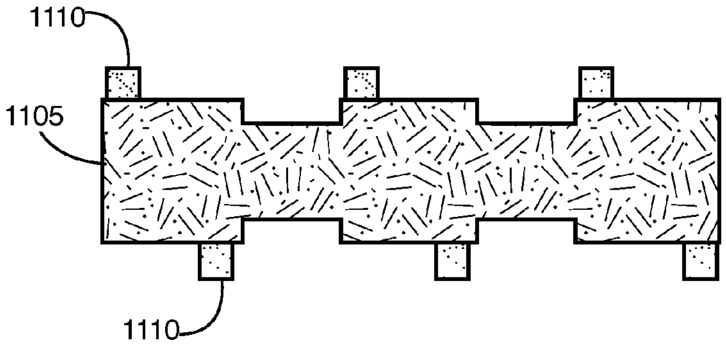
FIG. 11B illustrates a cross-section view of the plaque of FIG. 11A.
Figure 11C:
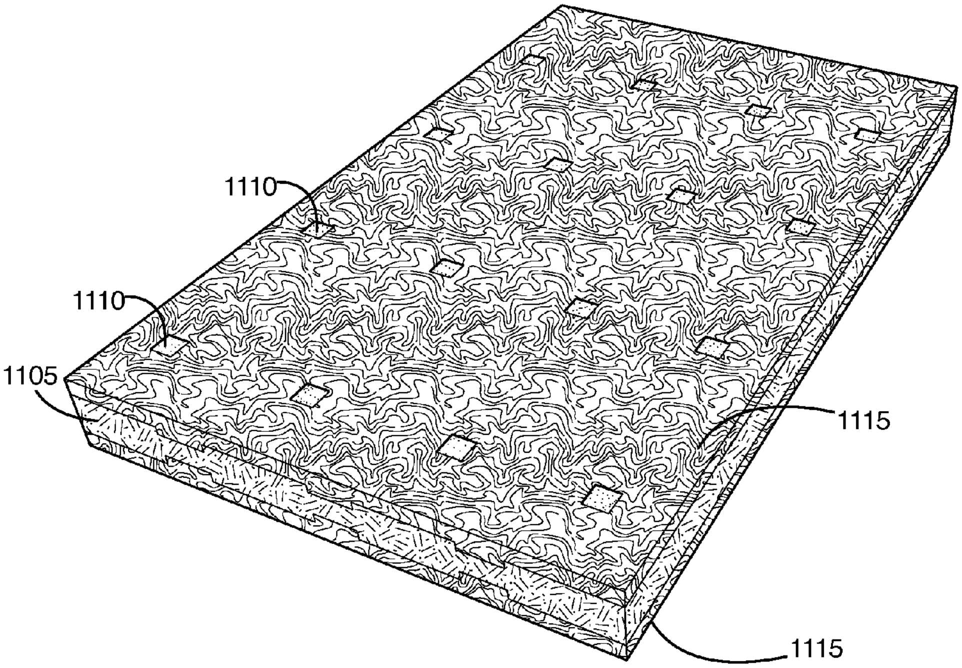
FIG. 11C illustrates the plaque cover with a top layer and a bottom layer of an encapsulant.
Figure 11D:
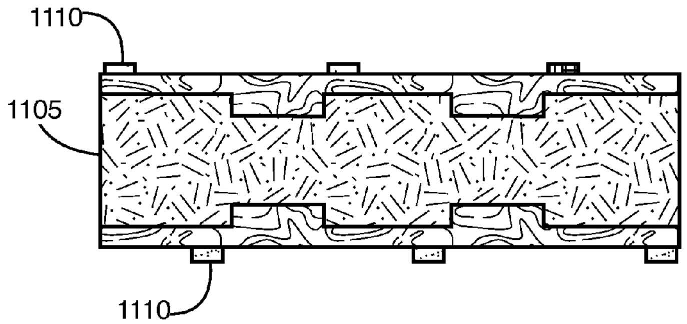
FIG. 11D illustrates a cross-section view of the plaque and encapsulant layers of FIG. 11C.

At block 1015, the plaque is encapsulated in an encapsulant 1115, as illustrated in FIGS. 11C and 11D, and allowed to cure. The encapsulant 1115 may be applied over the plaque via a screen-printing process whereby the encapsulant is provided in a liquid form and squeezed through a screen and on to the top and bottom surfaces of the plaque 1105. The liquid form of the encapsulant may have a viscosity of between about 1500 and 70,000 cps. The screen has open sections through which the liquid encapsulant flows, and closed sections that block the liquid encapsulant from reaching the plaque. The sections may be configured to allow the encapsulant to cover the entire surface area of the plaque 1105 with the exception of the conductive protrusions 1110. In other implementations, the conductive protrusions 1110 may be covered by the liquid encapsulant and subsequently exposed by grinding the encapsulant after the encapsulant has cured.

Figure 11E:
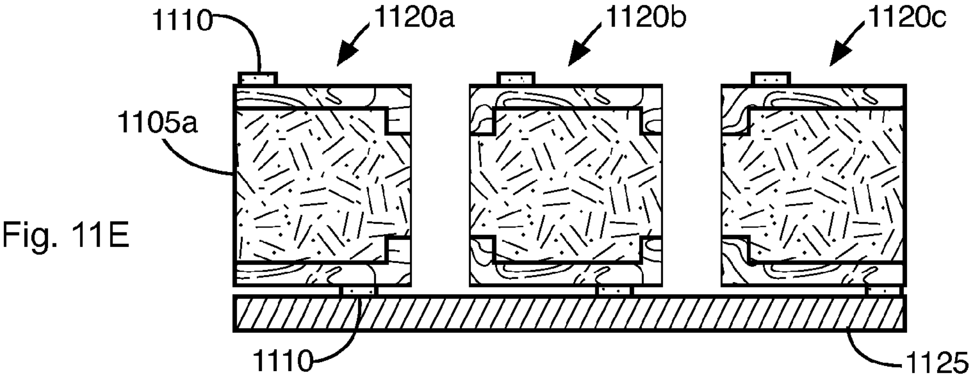
FIG. 11E illustrates a cross-section view of components cut from the plaque and encapsulant layers.

At block 1020, a tape layer 1125 may be applied over the conductive protrusions 1110 that extend from the bottom of the plaque 1105. The plaque 1105 is then cut to singulate the plaque 1105 into sections 1120*a-c*, as illustrated in FIG. 11E. The plaque 1105 may be cut using conventional processes (i.e., saw, laser, etc.) to singulate the plaque into separate components 1120*a-c*. Each component 1120*a-c* has a layer of encapsulant on the top surface and the bottom surface of a core 1105*a*, and at least a pair of conductive protrusions 1110, one on the top surface of the 1105*a* and another on the bottom surface of the core 1105*a*, that extend through the encapsulant. The tape layer 1125 is utilized to hold the components 1120*a-c* together for subsequent processing operations.

Figure 11F:
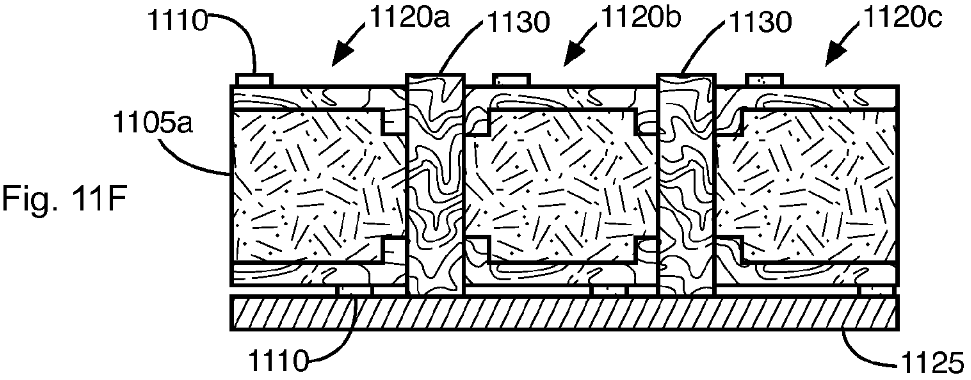
FIG. 11F illustrates a cross-section view of a space between the components filled with an encapsulant.
Figure 11G:
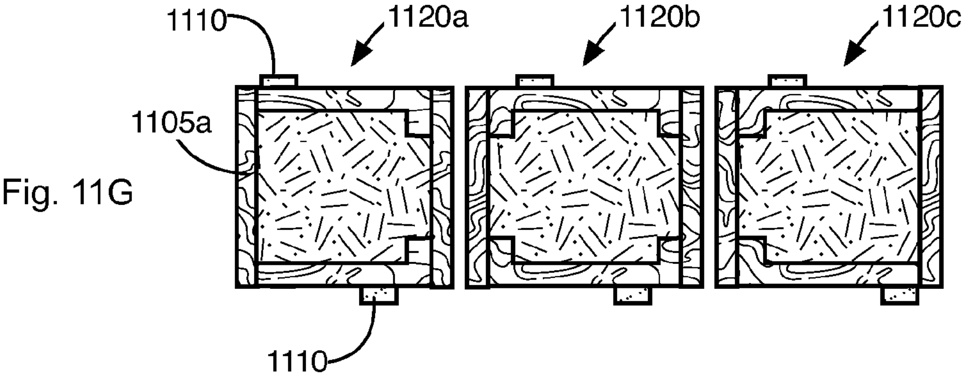
FIG. 11G illustrates a cross-section view of components where the encapsulant filled into the space between components is cut.
Figure 11H:
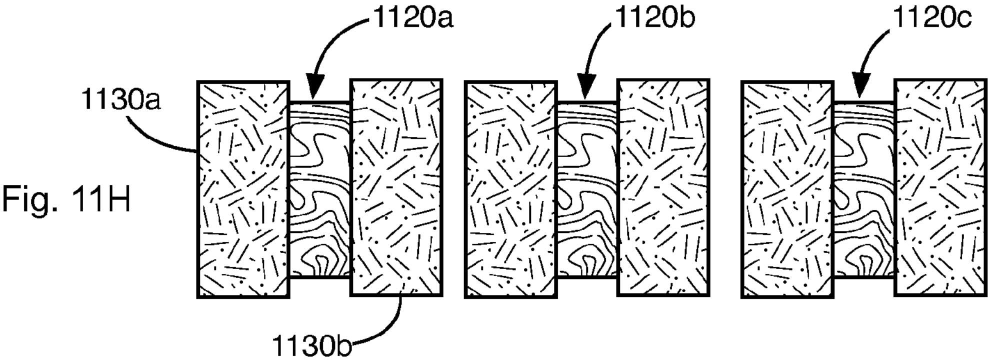
FIG. 11H illustrates a front view of the components with conductive layers added to the ends.

At block 1025, an encapsulant filler 1130 is inserted in the cuts formed between the singulated components 1120*a-c* to cover those surfaces of the core 1105*a* within the components 1120*a-c* that were exposed by the cutting, as illustrated in FIG. 11F. After the encapsulant filler 1130 has cured, the encapsulant filler 1130 is cut and the tape layer 1125 removed, as illustrated in FIG. 11G. The encapsulant filler 1130 is cut is such a way as to leave a portion of encapsulant over the previously exposed sidewalls of the cores 1105*a* of the components 1120*a-c*.

At block 1030, the ends of the singulated components 1120*a-c* may be plated to provide the first and second conductive ends 910*ab* described above. For example, a conductive epoxy layer 1130*ab* may be applied over the ends of the singulated components 1120*a-c*. The conductive epoxy layers 1130*ab* may cover part or all of the conductive protrusions 1110. In some implementations, a solderable nickel alloy finish may be provided over the conductive epoxy layer 1130*ab*.

As shown, the novel manufacturing methods are capable of producing SMD of various configurations. Moreover, these methods are capable of producing SMDs with smaller form factors capable of holding higher hold currents than those manufactured using conventional processes. For example, the operations described in FIG. 10 may be adapted somewhat to manufacture SMDs such as those shown in FIGS. 7 and 8. While the SMDs and the methods for manufacturing the SMDs have been described with reference to certain embodiments, it will be understood by those skilled in the art that various changes may be made and equivalents may be substituted without departing from the scope of the claims of the application. Many other modifications may be made to adapt a particular situation or material to the teachings without departing from the scope of the claims. Therefore, it is intended that SMDs and methods for manufacturing the SMDs are not to be limited to the particular embodiments disclosed, but to any embodiments that fall within the scope of the claims.

What is claimed is:

1. A method of manufacturing a surface mount device, the method comprising:
- forming a plaque from a material;
- forming a plurality of conductive protrusions on a top surface and a bottom surface of the plaque;
- applying a liquid encapsulant over at least a portion of the top surface and at least a portion of the bottom surface of the plaque;
- curing the liquid encapsulant, wherein the cured encapsulant has an oxygen permeability of less than about 0.4 cm3·mm/m2·atm·day;

cutting through the cured encapsulant and plaque to provide a plurality of components, after cutting, applying additional liquid encapsulant to sidewalls of each component that are exposed after cutting; and curing the liquid encapsulant so that the exposed sidewalls are entirely covered by the cured encapsulant;

wherein after cutting, the top surface of each component includes at least one conductive protrusion, the bottom surface of each component includes at least one conductive protrusion, the top surface and the bottom surface of each component include the cured encapsulant, and a core of each component includes the material; and forming first and second conductive layers over encapsulated ends of the component, the first and second conductive layers being formed and applied independently of the conductive protrusions on the top and bottom surfaces of the component, with the first conductive layer in electrical communication with at least one of the conductive protrusions on the top surface of the component and with the second conductive layer in electrical communication with at least one of the conductive protrusions on the bottom surface of the component.

2. The method according to claim 1, wherein the plaque material corresponds to a positive-temperature-coefficient (PTC) device.

3. The method according to claim 1, wherein the encapsulant corresponds to a thermoset epoxy.

4. The method according to claim 3, wherein in a liquid state, the epoxy has a viscosity of between about 1500 cps and 70,000 cps.

5. The method according to claim 3, wherein the epoxy comprises between about 5% to 95% filler content by weight.

6. The method according to claim 1, wherein the cured additional encapsulant fills a space between sidewalls of adjacent components that joins adjacent components to one another, and the method further comprises cutting through a middle section of the cured additional encapsulant to separate the joined components.

7. The method according to claim 1, wherein prior to cutting, the method further comprises applying a tape layer to the conductive protrusions on one of the top and the bottom surfaces to maintain a positional relationship between the components after cutting.

8. The method according to claim 7, wherein a screen utilized in the screen-printing is configured to prevent the liquid encapsulant from covering at least a portion of each of the plurality of conductive protrusions.

9. The method according to claim 1, wherein applying the liquid encapsulant over at least a portion of the top surface and at least a portion of the bottom surface of the plaque comprises screen-printing the liquid encapsulant on the plaque.

* * * * *